United States Patent
Ahn et al.

(10) Patent No.: US 11,543,432 B2
(45) Date of Patent: Jan. 3, 2023

(54) PROBE HEAD AND PROBE CARD HAVING SAME

(71) Applicant: POINT ENGINEERING CO., LTD., Asan-si (KR)

(72) Inventors: Bum Mo Ahn, Suwon-si (KR); Seung Ho Park, Hwaseong-si (KR); Sung Hyun Byun, Hwaseong-si (KR)

(73) Assignee: POINT ENGINEERING CO., LTD.

( * ) Notice: Subject to any disclaimer, the term of this patent is extended or adjusted under 35 U.S.C. 154(b) by 0 days.

(21) Appl. No.: 17/211,812

(22) Filed: Mar. 24, 2021

(65) Prior Publication Data
US 2021/0302471 A1 Sep. 30, 2021

(30) Foreign Application Priority Data
Mar. 30, 2020 (KR) .................. 10-2020-0038399

(51) Int. Cl.
*G01R 1/067* (2006.01)
*G01R 1/073* (2006.01)

(52) U.S. Cl.
CPC ..... *G01R 1/06794* (2013.01); *G01R 1/07314* (2013.01); *G01R 1/07371* (2013.01)

(58) Field of Classification Search
CPC .................. G01R 1/07314; G01R 1/07371
See application file for complete search history.

(56) References Cited

U.S. PATENT DOCUMENTS

| 2001/0011896 A1* | 8/2001 | Bayer ................ G01R 1/07314 |
| | | 324/750.25 |
| 2007/0269999 A1* | 11/2007 | Di Stefano ........ G01R 1/06738 |
| | | 439/73 |
| 2018/0088150 A1* | 3/2018 | Kuga ................. G01R 1/07314 |

FOREIGN PATENT DOCUMENTS

| EP | 344654 A | * | 12/1989 | ......... G01R 1/07328 |
| EP | 3492929 A1 | * | 6/2019 | ......... G01R 1/06711 |
| GB | 2086670 A | * | 5/1982 | ......... G01R 1/07378 |
| JP | 2004235591 A | * | 8/2004 | |
| JP | 2007208088 A | * | 8/2007 | .......... G01R 1/0425 |
| JP | 2018017575 A | | 2/2018 | |
| KR | 1662951 B1 | * | 10/2016 | ......... G01R 1/06722 |

* cited by examiner

*Primary Examiner* — Paresh Patel
(74) *Attorney, Agent, or Firm* — Renaissance IP Law Group LLP

(57) ABSTRACT

Proposed are a probe head and a probe card having the same. The probe head includes: an upper guide plate having an upper guide hole; a lower guide plate having a lower guide hole; an intermediate guide plate having an intermediate guide hole, and provided between the upper guide plate and the lower guide plate; and a guide member provided at a side of the intermediate guide plate, wherein the intermediate guide plate is limited in movement by the guide member.

5 Claims, 11 Drawing Sheets

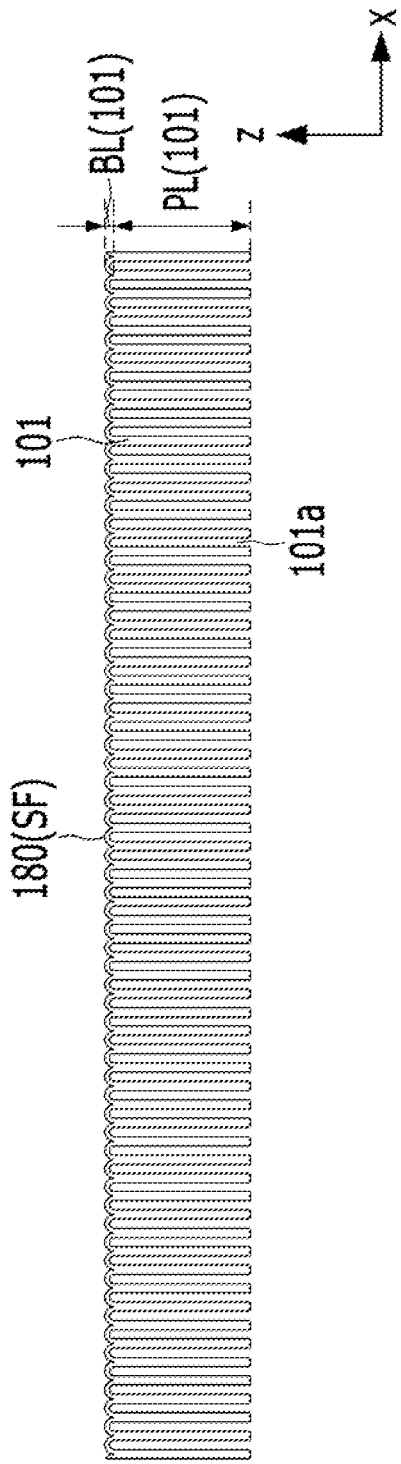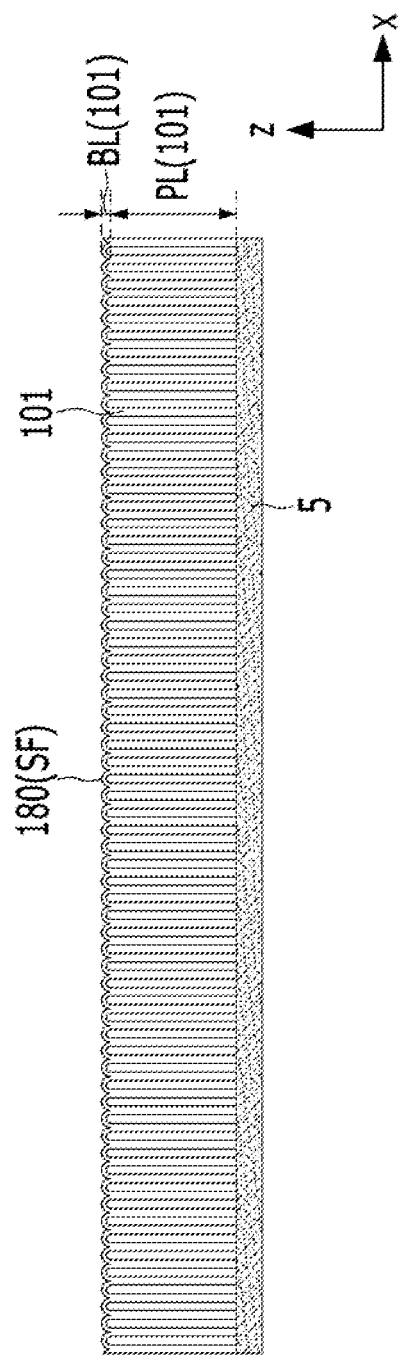

PROBE HEAD AND PROBE CARD HAVING SAME

CROSS REFERENCE TO RELATED APPLICATION

The present application claims priority to Korean Patent Application No. 10-2020-0038399, filed Mar. 30, 2020, the entire contents of which is incorporated herein for all purposes by this reference.

BACKGROUND

1. Field

The present disclosure relates generally to a probe head and a probe card having the same and, more particularly, to a probe head that guides the movement of an intermediate guide plate, and to a probe card having the same.

2. Description of the Related Art

In general, a semiconductor manufacturing process largely includes a fabrication process for forming a pattern on a wafer, an electrical die sorting (EDS) process for testing electrical characteristics of respective chips constituting the wafer, and an assembly process for assembling the wafer on which a pattern is formed to individual chips.

Here, the EDS process is performed to detect defective chips among the chips constituting the wafer. In the EDS process, a probe card which applies electrical signals to the chips constituting the wafer and determines whether the chips are defective on the basis of signals checked from the applied electrical signals is mainly used.

A probe card is a device that connects a semiconductor wafer (or a semiconductor device) and test equipment to test the operation of the semiconductor device, and serves to transmit electricity while connecting probes provided on the probe card to a wafer, and then sort defective semiconductor chips on the basis of feedback signals received thereby.

The probe card used for an electrical test of the semiconductor device may include a circuit board, an interposer, a space transformer, a probe head, and probes. In the probe card, an electrical path is provided through the circuit board, the interposer, the space transformer, and the probe head, and a pattern of a wafer is tested by the probes that directly contact the wafer.

The probe head supports the probes passing through the space transformer, and serves to prevent an electrical short due to contact between adjacent probes. Specifically, the probe head includes at least one guide plate, and the probes are inserted into guide holes formed in the guide plate and guided toward the wafer. After the insertion of the probes into the guide plate, pressure may be exerted on one side of the probes to cause the probes to be elastically deformed in one direction.

Then, when the wafer is moved toward the probe card for an electrical test on the wafer, the probes are brought into contact with electrode pads of the wafer and pushed upward thereby. That is, the probes are moved upward by the wafer. In this case, if all the guide plates of the probe head supporting the probes are fixed, pressure is exerted on the guide holes of the guide plate as the probes are moved. Therefore, when the test on the wafer is repeated, the guide holes may be worn as the probes are moved up and down.

An example of such a guide plate for a probe card for minimizing abrasion is disclosed in Japanese Patent Application Publication No. 2018-17575 (hereinafter referred to as "related art").

An electrical connection device of the related art includes an upper guide part, a lower guide part, and an intermediate guide part, and the intermediate guide part is configured to be movable in a direction orthogonal to a thickness direction. Therefore, when probes are moved, the intermediate guide part is moved in conjunction with the movement of the probes, which can prevent abrasion of guide holes of the guide part.

However, the intermediate guide part as above is movable not only in a deformed direction of the probes, but also in a direction opposite to the deformed direction of the probes. That is, when pressure is exerted on the probes by a wafer, if the intermediate guide part is moved in a direction opposite to the deformed direction of the probes, an unexpected pressure may be exerted on the probes. Thus, there is a need to guide the guide plate in an intended direction according to the deformed direction of the probes.

The foregoing is intended merely to aid in the understanding of the background of the present disclosure, and is not intended to mean that the present disclosure falls within the purview of the related art that is already known to those skilled in the art.

SUMMARY

Accordingly, the present disclosure has been made keeping in mind the above problems occurring in the related art, and an objective of the present disclosure is to provide a probe head that guides a moving direction of an intermediate guide plate in an intended direction, and a probe card having the same.

Another objective of the present disclosure is to provide a probe head that minimizes abrasion of a guide plate, and a probe card having the same.

Still another objective of the present disclosure is to provide a probe head that copes with a fine pitch of electrode pads of a wafer, and a probe card having the same.

In order to achieve the above objectives, according to one aspect of the present disclosure, there is provided a probe head of a probe card, the probe head including: an upper guide plate having an upper guide hole; a lower guide plate having a lower guide hole; an intermediate guide plate having an intermediate guide hole, and provided between the upper guide plate and the lower guide plate; and a guide member provided at a side of the intermediate guide plate, wherein the intermediate guide plate is limited in movement by the guide member.

Furthermore, the guide member may have a 'U' shape, and may be provided on each of all side surfaces of the intermediate guide plate except for one side surface.

Furthermore, the guide member may be provided on each of two side surfaces of the intermediate guide plate, and the respective guide members may be provided at positions facing each other.

Furthermore, the guide member may include a plurality of guide members each of which has a size equal to that of each of side surfaces of the intermediate guide plate, and the respective guide members may be selectively provided on the side surfaces of the intermediate guide plate.

According to another aspect of the present disclosure, there is provided a probe card, including: a space transformer having a probe connection pad electrically connected to each of a plurality of probes; and a probe head provided below the space transformer, wherein the probe head may include: an upper guide plate having an upper guide hole; a lower guide plate having a lower guide hole; an intermediate guide plate having an intermediate guide hole, and provided between the upper guide plate and the lower guide plate; and, a guide member provided at a side of the intermediate guide plate, wherein the intermediate guide plate may be limited in movement by the guide member.

As described above, in the probe head and the probe card having the same according to the present disclosure, it is possible to guide the moving direction of the intermediate guide plate in the intended direction.

In addition, it is possible to minimize abrasion of the guide plate.

In addition, it is possible to cope with the fine pitch of the electrode pads of the wafer.

BRIEF DESCRIPTION OF THE DRAWINGS

The above and other objectives, features, and other advantages of the present disclosure will be more clearly understood from the following detailed description when taken in conjunction with the accompanying drawings, in which:

FIGS. 4A, 4B, 4C, and 4D are views illustrating a method of manufacturing an intermediate guide plate illustrated in FIG. 1;

DETAILED DESCRIPTION

Figure 1:
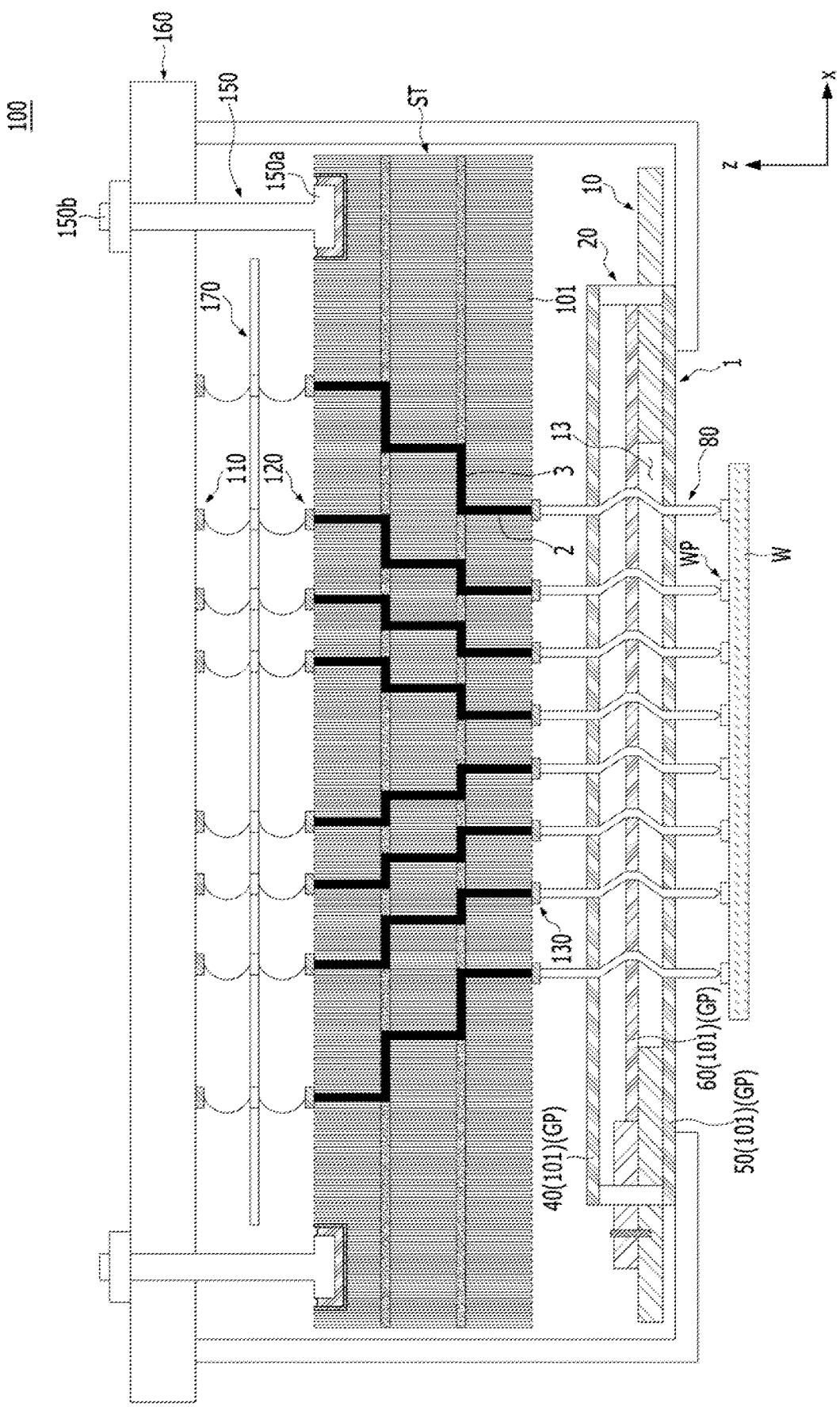
FIG. 1 is a view schematically illustrating a probe card according to an exemplary embodiment of the present disclosure.

Contents of the description below merely exemplify the principle of the present disclosure. Therefore, those of ordinary skill in the art may implement the theory of the present disclosure and invent various apparatuses which are included within the concept and the scope of the present disclosure even though it is not clearly explained or illustrated in the description.

Furthermore, in principle, all the conditional terms and embodiments listed in this description are clearly intended for the purpose of understanding the concept of the present disclosure, and one should understand that the present disclosure is not limited the exemplary embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to cross-sectional views and/or perspective views which schematically illustrate ideal embodiments of the present disclosure. For explicit and convenient description of the technical content, thicknesses and widths of members and regions in the figures may be exaggerated. Therefore, variations from the shapes of the illustrations as a result, for example, of manufacturing techniques and/or tolerances, are to be expected.

In addition, a limited number of holes are illustrated in the drawings. Thus, the embodiments should not be construed as limited to the particular shapes of regions illustrated herein but are to include deviations in shapes that result, for example, from manufacturing.

In describing various embodiments, the same reference numerals will be used throughout different embodiments and the description to refer to the same or like elements or parts. In addition, the configuration and operation already described in other embodiments will be omitted for convenience.

Hereinafter, exemplary embodiments of the present disclosure will be described in detail with reference to the accompanying drawings.

FIG. 1 is a view schematically illustrating a probe card 100 according to an exemplary embodiment of the present disclosure. In this figure, for convenience of description, the number and size of a plurality of probes 80 are illustrated exaggeratedly.

Depending on the structure of installing the probes 80 on a space transformer ST and the structure of the probes 80, the types of the probe card 10 may be classified into a vertical type probe card, a cantilever type probe card, a micro-electro-mechanical system (MEMS) probe card. In the present disclosure, as an example, a vertical type probe card 100 is illustrated to describe a coupling structure between the space transformer ST and other peripheral parts. The type of the probe card in which the coupling structure between the space transformer ST and other peripheral parts is implemented is not limited thereto, and may be the MEMS probe card and the cantilever type probe card.

FIG. 1 illustrates a contact state of electrode pads WP of a wafer W. A test for electrical characteristics of semiconductor devices is performed by approaching the wafer W to the probe card 100 having the plurality of probes 80 on a wiring substrate, and bring the respective probes 80 into contact with corresponding electrode pads WP on the wafer W. After the probes 80 reach positions where the probes 80 are brought into contact with the electrode pads WP, the wafer W may be further lifted by a predetermined height toward the probe card 100. This process may be overdrive.

As illustrated in FIG. 1, the probe card 100 according to the present disclosure may include: the space transformer ST made of anodic aluminum oxide 101, and including a vertical wiring part 2, a horizontal wiring part 3 connected to the vertical wiring part 2, and a probe connection pad 130 electrically connected to each of the plurality of probes 80; and a coupling member 150 having a first end 150a fixed to a surface of the space transformer ST and a second end 150b coupled to the circuit board 160 provided above the space transformer ST. In this case, the coupling member 150 may be configured as a bolt, but is not limited thereto.

As illustrated in FIG. 1, the circuit board 160 may be provided above the space transformer ST, and the probe head 1 on which the plurality of probes 80 are provided may be provided below the space transformer ST. In other words, the space transformer ST may be located between the circuit board 160 and the probe head 1. The space transformer ST may be coupled to peripheral parts by the coupling member 150.

The space transformer ST coupled to the circuit board 160 by the coupling member 150 may be electrically connected thereto by an interposer 170 interposed between the circuit board 160 and the space transformer ST. Specifically, a first interposer connection pad 110 may be provided on an upper surface of the space transformer ST, and a second interposer connection pad 120 may be provided on a lower surface of the circuit board 160. Therefore, the interposer 170 interposed between the space transformer ST and the circuit board 160 may be joined to the first interposer connection pad 110 and the second interposer connection pad 120 to form an electrical connection between the space transformer ST and the circuit board 160.

The space transformer ST may be made of the anodic aluminum oxide 101. The anodic aluminum oxide 101 refers to a film formed by anodizing a metal that is a base material, and pores 101a refer to pores formed in the anodic aluminum oxide 101 during the process of forming the anodic aluminum oxide 101 by anodizing the metal. For example, in a case where the metal as the base material is aluminum (Al) or an aluminum alloy, the anodization of the base material forms the anodic aluminum oxide 101 consisting of aluminum oxide ($Al_2O_3$) on a surface SF of the base material. The anodic aluminum oxide 101 formed as such is divided into a barrier layer BL in which no pores 101a are formed and a porous layer PL in which pores 101a are formed. The barrier layer BL is positioned on the base material, and the porous layer PL is positioned on the barrier layer BL. In a state in which the anodic aluminum oxide 101 having the barrier layer BL and the porous layer PL is formed on the surface SF of the base material, when the base material is removed, only the anodic aluminum oxide 101 consisting of aluminum oxide ($Al_2O_3$) remains. The resulting anodic aluminum oxide 101 has the pores 101a that have a uniform diameter, are formed in a vertical shape, and have a regular arrangement. In this case, when the barrier layer BL is removed, a structure in which the pores 101a vertically pass through the anodic aluminum oxide 101 from top to bottom is formed.

The anodic aluminum oxide 101 has a coefficient of thermal expansion of 2 to 3 ppm/° C. This may result in less deformation due to temperature. In addition, the coefficient of thermal expansion of the anodic aluminum oxide 101 is close to the coefficient of thermal expansion of the wafer W as an object to be tested, so that positional misalignment between the probes 80 and the electrode pads WP may be minimized even under a high-temperature environment.

According to the present disclosure, by configuring the space transformer ST using the anodic aluminum oxide 101, the space transformer ST having less thermal deformation under a high-temperature environment may be implemented.

The probe head 1 is provided below the space transformer ST. The probe head 1 may include a support member 10, a fixing member 20, a guide plate GP including upper, intermediate, and lower guide plates 40, 50, and 60, and a guide member 70.

The probe head 1 supports the probes 80 and may have a structure in which the upper guide plate 40, the intermediate guide plate 60, and the lower guide plate 50 are sequentially provided. Specifically, the lower guide plate 50 may be provided at the bottom, the upper guide plate 40 is provided at a predetermined distance above the lower guide plate 50, and the intermediate guide plate 60 may be provided between the upper guide plate 40 and the lower guide plate 50. In this case, the support member 10 may be provided on the lower guide plate 50 to support the intermediate guide plate 60 from below, and the upper guide plate 40 and the lower guide plate 50 may be coupled to each other by a plurality of fixing members 20.

The upper guide plate 40 may have a size equal to that of the lower guide plate 50, and the intermediate guide plate 60 may have a size smaller than that of each of the upper guide plate 40 and the lower guide plate 50.

The probes 80 may sequentially pass through the upper guide plate 40, the lower guide plate 50, and the intermediate guide plate 60 to be provided toward the wafer W, and may be elastically deformed as the intermediate guide plate 60 is moved. In this case, the intermediate guide plate 60 may be horizontally shifted on the support member 10. Hereinafter, the configuration of the probe head 1 will be described in detail with reference to FIGS. 2 and 3.

Figure 2:
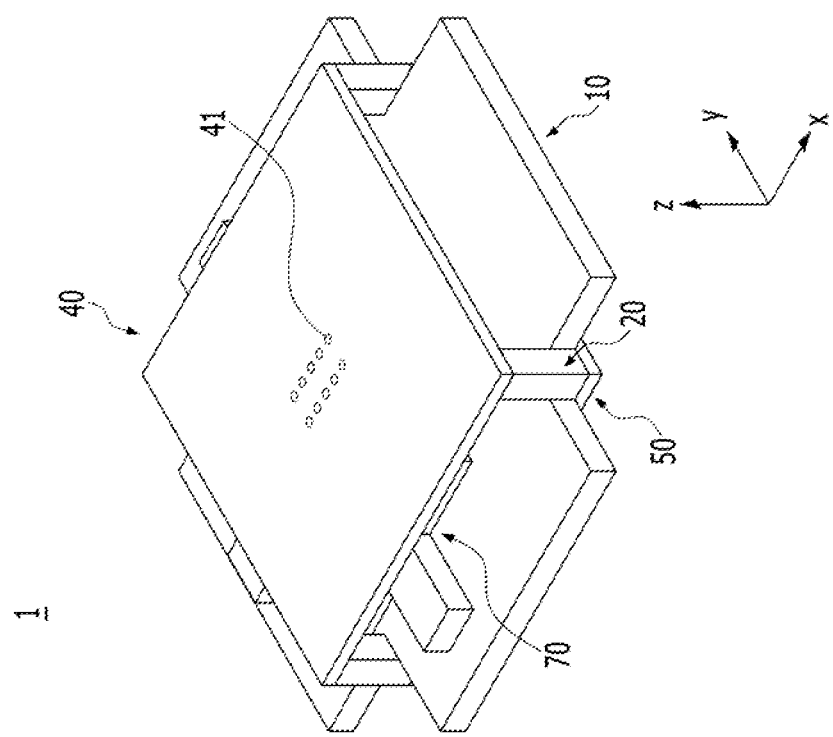
FIG. 2 is a perspective view illustrating a probe head constituting the present disclosure.
Figure 3:
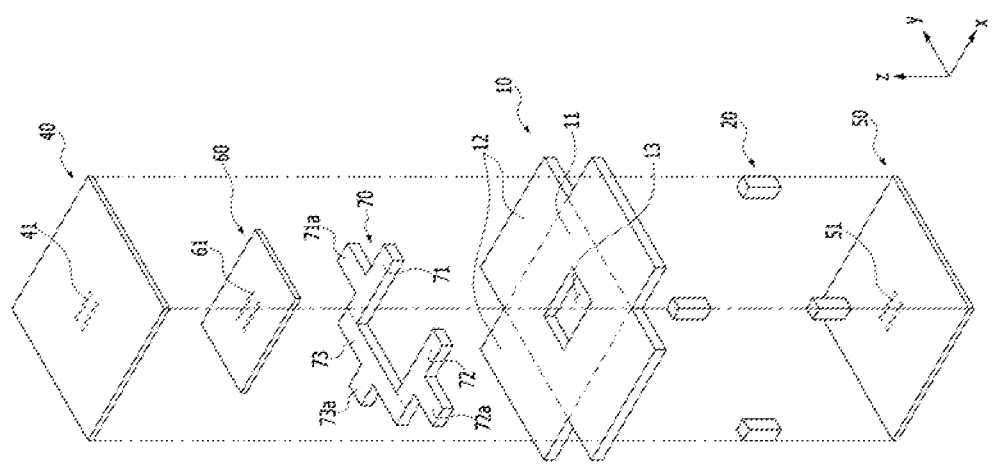
FIG. 3 is an exploded perspective view illustrating the probe head constituting the present disclosure.

FIG. 2 is a perspective view of the probe head constituting the present disclosure, and FIG. 3 is an exploded perspective view illustrating the probe head constituting the present disclosure.

As illustrated in FIGS. 2 and 3, the guide plate GP includes the upper guide plate 40, the lower guide plate 50, and the intermediate guide plate 60.

The upper guide plate 40, the lower guide plate 50, and the intermediate guide plate 60 may include an upper guide hole 41, a lower guide hole 51, and an intermediate guide hole 61, respectively, that allow insertion of each of the probes 80. The positions, shapes, and numbers of the upper guide hole 41, the lower guide hole 51, and the intermediate guide hole 61 are illustrated as an example, and thus the positions, shapes, and numbers thereof are not limited thereto.

The support member 10 may include a first body 11 having a quadrangular area and a plurality of second bodies 12 each provided on a side surface of the first body 11. Specifically, the first body 11 of the support member 10 may have a size that is smaller than that of each of the upper guide plate 40 and the lower guide plate 50, and larger than that of the intermediate guide plate 60.

The first body 11 may have a predetermined height, and the second bodies 12 may be provided on the respective side surfaces of the first body 11. Each of the second bodies 12 may have the same height as the first body 11 and may have a quadrangular area. For example, the probe head 1 may include four second bodies 12 having the same size and shape, and the respective second bodies 12 may be provided on the side surfaces of the first body 11.

The first body 11 may have a through-hole 13 formed therein. The through-hole 13 may be provided to allow the plurality of probes 80 inserted through the upper guide plate 40 and the intermediate guide plate 60 to be positioned therein. Therefore, the through-hole 13 may be formed at a position corresponding to a position where the respective upper guide holes 41 of the upper guide plate 40 and the respective intermediate guide holes 61 of the intermediate guide plate 60 are formed, to allow the plurality of probes 80 to be positioned therein, and in consideration of the elastic deformation of the plurality of probes 80, may have an inner diameter capable of receiving the elastic deformation.

The plurality of probes 80 may be inserted into and through the respective upper guide holes 41 of the upper guide plate 40 and inserted into and through the respective lower guide holes 51 of the lower guide plate 50 through the respective intermediate guide holes 61, so that the plurality of probes 80 may be positioned inside the through-hole 13.

The lower guide plate 50 is provided on a lower surface of the support member 10. That is, the support member 10 may be provided between the lower guide plate 50 and the intermediate guide plate 60. In this case, the lower guide holes 51 of the lower guide plate 50 may be provided at positions corresponding to the through-hole 13 to allow the probes 80 having passed through the through-hole 13 to pass therethrough. However, since this is illustrated as an example, the position of the support member 10 is not limited thereto.

The lower guide plate 50 may have a size larger than that of the first body 11, so that when the lower guide plate 50 is provided on the lower surface of the support member 10, the lower guide plate 50 may be exposed outside of the first body 11. In this case, the plurality of fixing members 20 may be provided at a side of the lower guide plate 50 exposed outside of the first body 11.

The fixing members 20 couple the upper guide plate 40 and the lower guide plate 50 to each other, and may be provided between the upper guide plate 40 and the lower guide plate 50. Specifically, the fixing members 20 may have a shape extending in a vertical direction, and may be provided on an upper surface of the lower guide plate 50 so as not to overlap with the first body 11. In addition, the upper guide plate 40 may be provided on upper surfaces of the fixing members 20. That is, the lower guide plate 50 may be provided on lower surfaces of the fixing member 20, and the upper guide plate 40 may be provided on the upper surfaces thereof. Therefore, the upper guide plate 40 and the lower guide plate 50 may be positioned spaced apart from each other by a distance defined by a vertical length of each of the fixing members 20, and the intermediate guide plate 60 and the support member 10 may be positioned between the upper guide plate 40 and the lower guide plate 50.

Specifically, the fixing members 20 may be provided between the respective the second bodies 12. As an example, one fixing member 20 may be provided between each two adjacent second bodies 12. Therefore, four fixing members 20 may be provided between the upper guide plate 40 and the lower guide plate 50.

With this structure, handling of the probe head 1 may be facilitated. Specifically, when ends of the plurality of probes 80 first inserted through the guide holes 41, 51, and 61 are front ends of the probes 80, the upper guide plate, 40, the lower guide plate 50, and the intermediate guide plate 60 may serve to guide the front ends of the probes 80. That is, the upper guide plate, 40, the lower guide plate 50, and the intermediate guide plate 60 may define a probing area of the probe card 100. Therefore, on the entire area of the probe head 1, an area occupied by the upper guide plate, 40, the lower guide plate 50, and the intermediate guide plate 60 may be the probing area.

At least one of the upper guide plate, 40, the lower guide plate 50, and the intermediate guide plate 60 may be made of anodic aluminum oxide 101. In addition, the space transformer ST constituting the present disclosure, and the upper guide plate 40, the lower guide plate 50, and the intermediate guide plate 60 defining a substantial probing area by having guide holes GH into which the plurality of probes 80 are inserted may be made of the same anodic aluminum oxide 101.

The probe card 100 may perform an electronic die sorting (EDS) process for testing electrical characteristics of each chip constituting a wafer. The EDS process may be performed under a high-temperature environment. Therefore, as the overall temperature of the probe card 100 increases, the upper guide plate 40, the lower guide plate 50, and the intermediate guide plate 60 may be thermally expanded. In this case, when at least one of the upper guide plate, 40, the lower guide plate 50, and the intermediate guide plate 60 is made of the anodic aluminum oxide 101, such thermal deformation may not easily occur.

Each of the upper guide plate, 40, the lower guide plate 50, and the intermediate guide plate 60 may be made of anodic aluminum oxide 101 having light-transmitting properties, so that a problem of reducing positional accuracy of the upper guide holes 41, the lower guide hole 51, and the intermediate guide holes 61 may be prevented. In addition, when at least one of the upper guide plate, 40, the lower guide plate 50, and the intermediate guide plate 60 is made of the light-transmitting anodic aluminum oxide 101, insertion of the probes 80 may be facilitated.

The upper guide plate 40, the lower guide plate 50, and the intermediate guide plate 60 made of the anodic aluminum oxide 101 may undergo an etching process to form the upper guide holes 41, the lower guide holes 51, and the intermediate guide holes 61. In the case of the anodic aluminum oxide 101, the upper guide holes 41, the lower guide holes 51, and the intermediate guide holes 61 may be vertically formed by the etching process. This may make it possible to implement a fine size and fine pitch of the upper guide holes 41, the lower guide holes 51, and the intermediate guide holes 61.

In the probe card 100 according to the present disclosure, since the space transformer ST having the respective probe connection pads 130, and at least one of the upper guide plate 40, the lower guide plate 50, and the intermediate guide plate 60 provided below the space transformer ST and having the probes 80 therein may be made of the same anodic aluminum oxide 101, a problem in which the probe connection pads 130 and the probes 80 coming into contact with the probe connection pads 130 are misaligned due to thermal deformation may be prevented. As a result, probing reliability of the vertical type probe card 100, which is overdriven to test electrical characteristics of a wafer, may be increased.

The guide member 70 is provided at a side of the intermediate guide plate 60. The guide member 70 serves to guide the movement of the intermediate guide plate 60 and may be positioned on an upper surface of the support member 10.

The guide member 70 may be positioned on a side surface of the support member 10. For example, the guide member 70 may include a first guide member 71, a second guide member 72 facing the first guide member 71, and a third guide member 73 connecting the first guide member 71 and the second guide member 72 to each other. That is, the guide member 70 may have a 'U' shape.

Specifically, the first guide member 71 may be positioned on a side surface of the intermediate guide plate 60, the second guide member 72 may be positioned on a side surface thereof facing the side where the first guide member 71 is positioned, and the third guide member 73 may be positioned on a side surface thereof where the first guide member 71 and the second guide member 72 are not positioned. In this case, the first guide member 71, the second guide member 72, and the third guide member 73 may be integrally formed as a single body, but the guide member 70 is not limited thereto. For example, the first guide member 71, the second guide member 72, and the third guide member 73 may be provided separately and may be coupled to each other after being positioned on the respective side surfaces of the intermediate guide plate 60. In this case, the first guide member 71, the second guide member 72, and the third guide member 73 may be in a state in contact with the side surfaces of the intermediate guide plate 60, and the guide member 70 may be provided on each of all the side surfaces of the intermediate guide plate 60 except for one side surface.

The first guide member 71, the second guide member 72, and the third guide member 73 may have a quadrangular shape, and may be positioned on the first body 11 or the second bodies 12.

The guide member 70 may include a first protruding member 71a, a second protruding member 72a, and a third protruding member 73a. Specifically, the first protruding member 71a may have a shape protruding from the first guide member 71, and the second protruding member 72a may have a shape protruding from the second guide member 72, and the third protruding member 73a may have a shape protruding from the third guide member 73. When the guide member 70 is positioned on the upper surface of the support member 10, at least a portion of each of the first protruding member 71a, the second protruding member 72a, and the third protruding member 73a may be positioned at a position corresponding to an associated one of the second bodies 12. Therefore, when the fixing members 20, the intermediate guide plate 60, and the guide member 70 are positioned between the upper guide plate 40 and the lower guide plate 50, the second bodies 2 may be exposed outside of the fixing members 20, so that the at least the portion of each of the first protruding member 71a, the second protruding member 72a, and the third protruding member 73a may be exposed outside of the fixing members 20.

The guide member 70 may be made of a buffer material. Therefore, when coming into contact with the intermediate guide plate 60 and collides therewith, the guide member 70 may absorb an impact generated by the collision.

FIGS. 4A, 4B, 4C, and 4D are views illustrating a method of manufacturing an intermediate guide plate illustrated in FIG. 1.

A guide plate GP illustrated in FIGS. 4A, 4B, 4C, and 4D may be at least one of an upper guide plate 40, a lower guide plate 50, and an intermediate guide plate 60, and hereinafter will be described as being the intermediate guide plate 60 as an example. In FIGS. 4A, 4B, 4C, and 4D, for convenience of explanation, a portion of the intermediate guide plate 60 having an intermediate guide hole 61 is enlarged and schematically illustrated.

As illustrated in FIG. 4A, anodic aluminum oxide 101 including pores 101a may be provided. Then, as illustrated in FIG. 4B, a film 5 may be provided under the anodic aluminum oxide 101. In this case, the anodic aluminum oxide 101 may be provided in a state in which a barrier layer BL is not removed, and the barrier layer BL may be provided on an upper surface 180 of the anodic aluminum oxide 101 on which the film 5 is not provided. That is, a porous layer PL may be provided between the barrier layer BL and the film 5. Since the upper surface 180 of the intermediate guide plate 60 may be composed of the barrier layer BL, a problem in which particles flow into the intermediate guide plate 60 through the pores 101a may be prevented. In addition, inner walls of openings of the guide plate GP, into which front ends of probes 80 are first inserted during insertion of the probes 80, may be composed of the barrier layer BL having a high degree of density, thus having a high degree of durability. This may prevent abrasion of inner walls of openings of guide holes GH that may occur simultaneously with the insertion of the probes 80. As a result, a particle generation problem due to abrasion of the inner walls of the openings of the guide holes GH may be minimized.

Figure 4C:
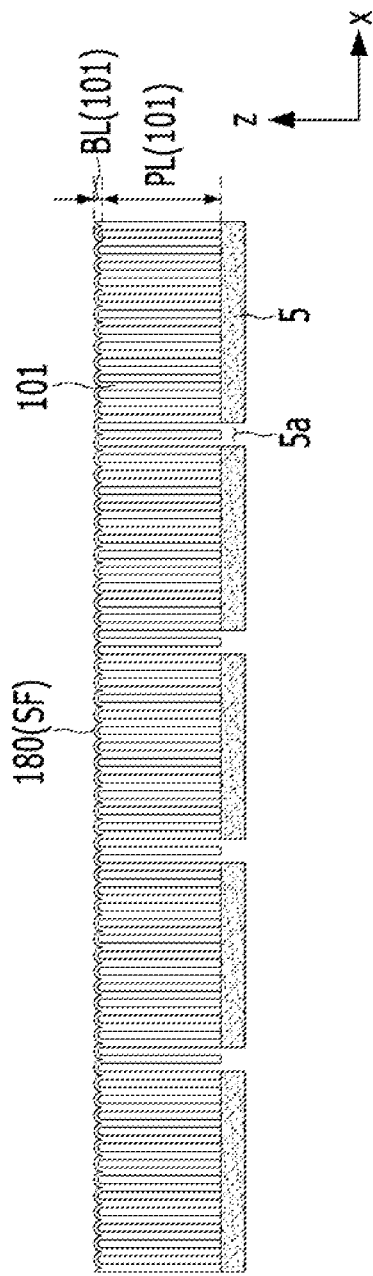

As illustrated in FIG. 4C, at least a portion of the film 5 may be patterned by a photo process. Therefore, a plurality of film holes 5a may be formed in the film 5.

Figure 4D:
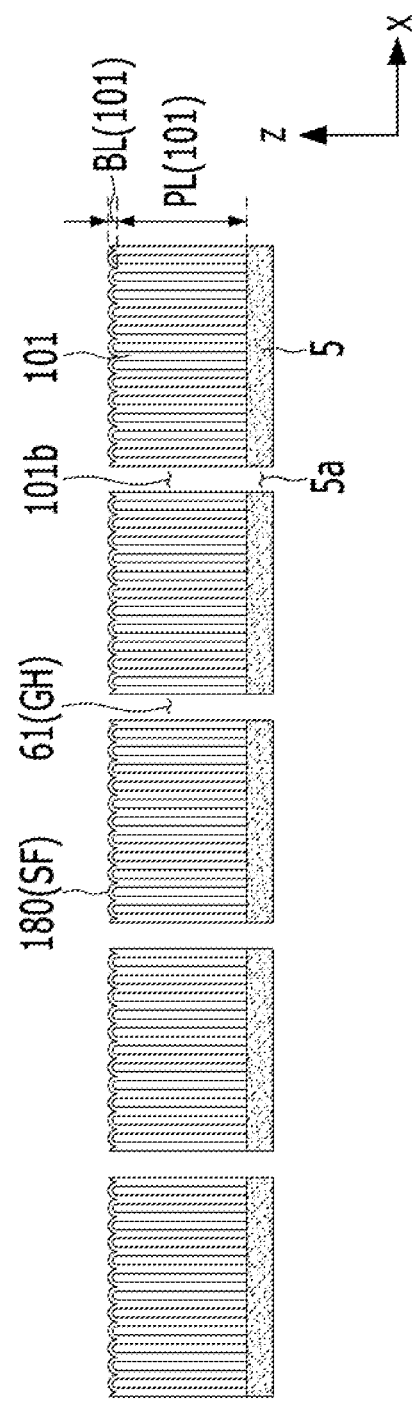

As illustrated in FIG. 4D, the anodic aluminum oxide 101 may be etched through the film holes 5a, which are areas removed by patterning. Therefore, by such etching, a plurality of intermediate guide holes 61 corresponding to the film holes 5a may be formed in the anodic aluminum oxide 101. That is, the intermediate guide holes 61 may be holes having the same size as the film holes 5a.

The intermediate guide plate 60 in which the intermediate guide holes 61 are formed may be provided on a support member 10 after the film 5 is removed. However, the intermediate guide plate 60 is not limited thereto, and may be provided on the support member 10 with the film 5 provided thereon.

The film 5 may be made of a photosensitive material, and preferably, the film 5 is a photosensitive film capable of lithography. In addition, the film 5 may be a material capable of adhesion, and thus, the anodic aluminum oxide 101 and the film 5 may be bonded without use of a separate adhesive means.

The intermediate guide plate 60 may be provided by stacking a plurality of anodic aluminum oxides 101. In this case, the film 5 may be positioned between each of the plurality of anodic aluminum oxides 101, and the plurality of anodic aluminum oxides 101 may be bonded to each other by the respective films 5.

Since the intermediate guide plate 60 may be composed of the stacked anodic aluminum oxides 101, strength of the intermediate guide plate 60 may be increased. That is, the intermediate guide plate 60 may effectively support the probes 80.

In a conventional guide plate, insertion holes for probes are formed by mechanical processing such as laser or drilling processing. Therefore, a residual stress is generated when mechanically processing the insertion holes in the guide plate, resulting in a problem of deteriorating durability during use of a probe card. In addition, the holes formed by laser processing are not vertical, resulting in a problem in which a clearance occurs after insertion of the probes. On the contrary, in the intermediate guide plate 60 according to the present disclosure, since the intermediate guide holes 61 are formed by etching, the problems caused by mechanical processing may be prevented, and the intermediate guide holes 61 in which inner walls thereof are vertical in a straight line may be formed. This thus may facilitate the insertion of the probes 80, and prevent a clearance from occurring.

In the present disclosure, only the method of manufacturing the intermediate guide plate 60 has been described, but when each of the upper guide plate 40 and the lower guide plate 50 is made of the anodic aluminum oxide 101, a plurality of upper guide holes 41 and a plurality of lower guide holes 51 may be formed through the same process.

Figure 5A:
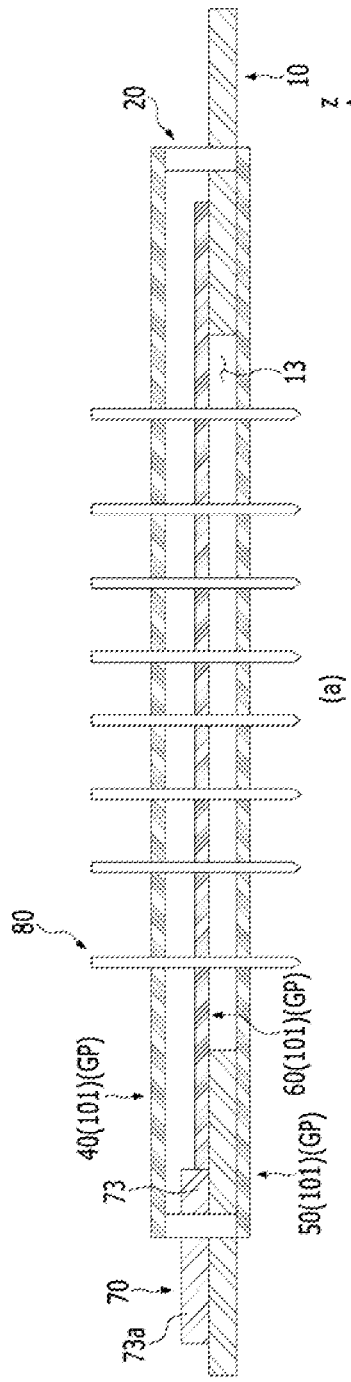
FIGS. 5A and 5B are views illustrating a probe head illustrated in FIG. 1.
Figure 5B:
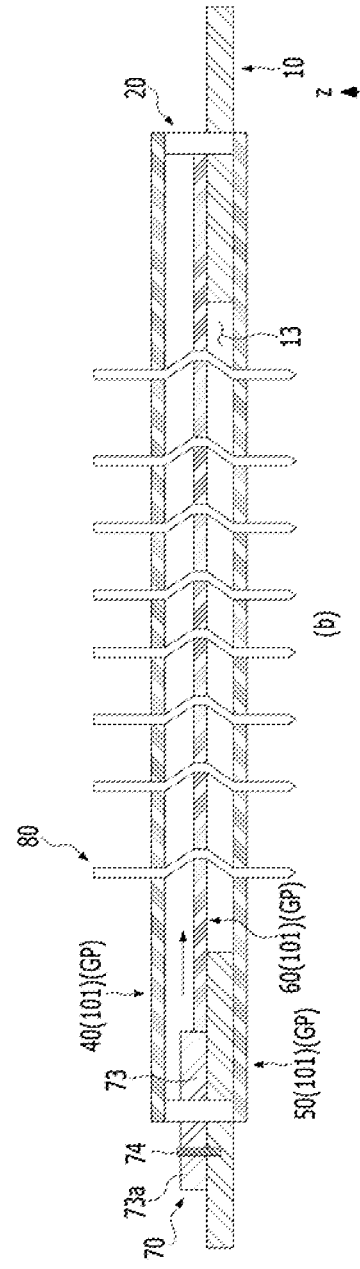
Figure 6:
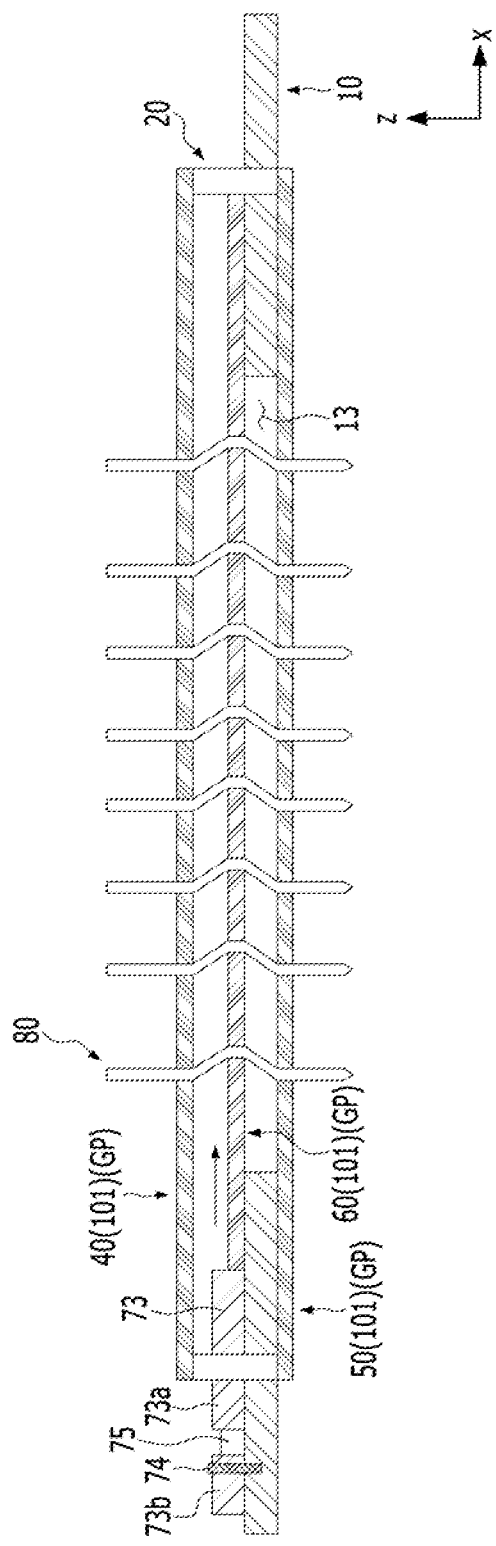
FIG. 6 is a view illustrating a modified example of the probe head illustrated in FIG. 1.
Figure 7A:
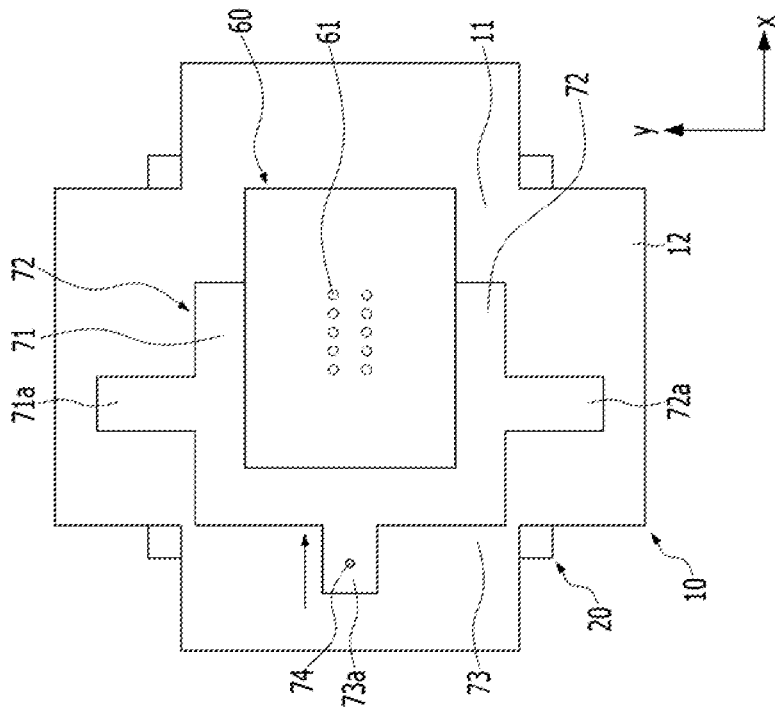
FIGS. 7A and 7B are top views illustrating the probe head illustrated in FIG. 2, except for an upper guide plate.
Figure 7B:
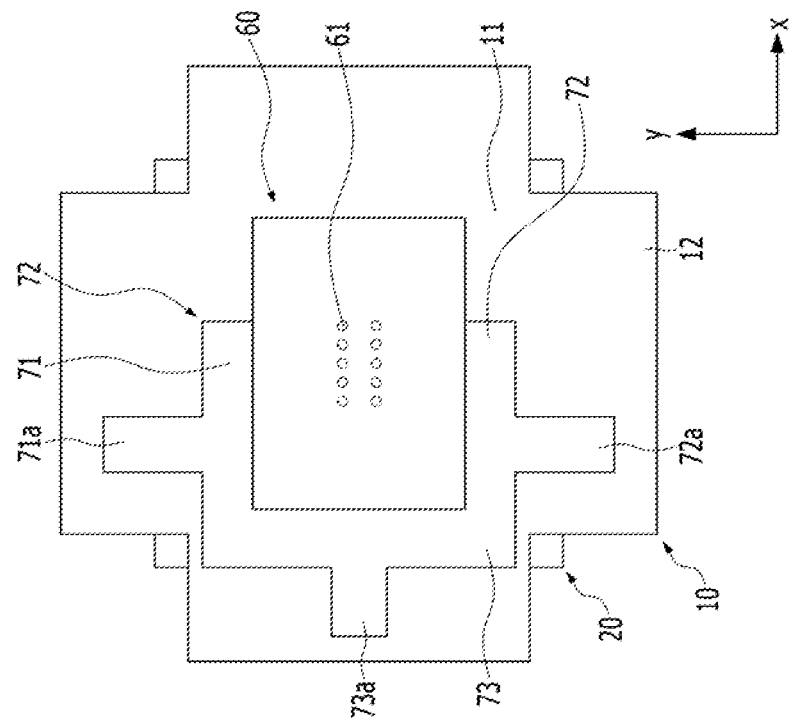

FIGS. 5A and 5B are views illustrating a probe head illustrated in FIG. 1; FIG. 6 is a view illustrating a modified example of the probe head illustrated in FIG. 1; and FIGS. 7A and 7B are top views illustrating the probe head illustrated in FIG. 2, except for an upper guide plate. In this case, FIG. 5A illustrates the probes 80 before undergoing elastic deformation, and FIG. 5B illustrates the probes 80 after undergoing elastic deformation. In addition, the probes 80 are not illustrated in FIG. 7 for convenience of explanation. However, FIG. 7A illustrates the probe head 1 when the probes 80 before elastic deformation are inserted, and FIG. 7B illustrates the probe head 1 when the probes 80 after elastic deformation are inserted.

Referring to FIGS. 5A and 5B, the probes 80 may vertically pass through the upper guide plate 40, the lower guide plate 50, and the intermediate guide plate 60. In this case, the probes 80 may be provided in a vertical shape without deformation.

Specifically, the probes 80 may pass through the upper guide holes 41 of the upper guide plate 40, then pass through the intermediate guide holes 61 of the intermediate guide plate 60, and finally pass through the lower guide holes 51 of the lower guide plate 50.

Each of the upper guide plate 40 and the intermediate guide plate 60 may be made of a light-transmitting material. Therefore, a user can more accurately identify the intermediate guide holes 61 and the lower guide holes 51 through the upper guide plate 40 and intermediate guide plate 60. That is, an effect of facilitating the insertion of the probes 80 may be obtained.

After the probes 80 sequentially pass through the upper guide plate 40, the intermediate guide plate 60, and the lower guide plate 50, the intermediate guide plate 60 and the guide member 70 are horizontally moved relative to each other. Specifically, as the guide member 70 is moved, the intermediate guide plate 60 in contact with the guide member 70 may be moved in conjunction with the movement thereof.

As illustrated in FIG. 5A, when the upper guide plate 40, the lower guide plate 50, and the intermediate guide plate 60 are aligned, the upper guide holes 41, the lower guide holes 51, and the intermediate guide holes 61 may be positioned on the same vertical line, and in this state, the probes 80 may vertically pass through the upper guide holes 41, the intermediate guide holes 61, and the lower guide holes 51.

When the insertion of the probes 80 is completed, as illustrated in FIGS. 5B and 7B, the intermediate guide plate 60 and the guide member 70 may be moved horizontally (in the direction indicated by an arrow). That is, the intermediate guide plate 60 may be moved toward a direction in which the guide member 70 is positioned In this case, the intermediate guide plate 60 may be limited in movement toward the guide member 70 by the guide member 70.

When the intermediate guide plate 60 and the guide member 70 are moved in one direction, the positions of the upper guide holes 41 may be also changed, and the probes 80 may be elastically deformed in conjunction with the positional movement of the upper guide hole 41. That is, intermediate portions of the probes 80 that have passed through the intermediate guide holes 61 may be deformed in the moving direction of the intermediate guide plate 60, and upper and lower portions of the probes 80 that have passed through the upper guide holes 41 and the lower guide holes 51 may be maintained in a vertical state. Therefore, when the intermediate guide plate 60 and the guide member 70 are moved, as illustrated in FIG. 5B, an elastically deformable structure of the probes 80 may be implemented.

When the movement of the intermediate guide plate 60 and the guide member 70 is completed, the guide member 70 may be coupled to the support member 10 by a coupling means 74. In this case, the coupling means 74 may be provided on each of the first protruding member 71a, the second protruding member 72a, and the third protruding member 73a. The coupling means 74 may be configured as a bolt or screw, but the type of the coupling means 74 is not limited thereto.

In addition, the coupling method of the guide member 70 and the support member 10 is not limited thereto. For example, as illustrated in FIG. 6, the guide member 70 may further include an extension member 73b and a buffer member 75. Specifically, the extension member 73b may be provided at a predetermined distance apart from the third protruding member 73a, and the buffer member 75 may be provided between the third protruding member 73a and the extension member 73b.

When the positions of the guide member 70 and the intermediate guide plate 60 are determined, the guide member 70 may be coupled to the support member 10 by passing the coupling means through the extension member 73b. Therefore, when the intermediate guide plate 60 is moved toward the guide member 70 and pressure is thereby exerted on the guide member 70, the buffer member 75 may absorb an impact between the guide member 70 and the intermediate guide plate 60. In this case, the buffer member 75 may be configured as a spring, but the material of the buffer member 75 is not limited thereto, and various buffer materials may be used.

In the present embodiment, although it is illustrated as an example that the third protruding member 73a further includes the extension member 73b and the buffer member 75, each of the first protruding member 71a and the second protruding member 72a may also further include an extension member and a buffer member. In this case, the shape and material of the extension member and the buffer member provided at each of the first and second protruding members 71a and 72a may be the same as the extension member 73b and the buffer member 75 provided at the third protruding member 73a.

In the conventional guide plate, the position of the guide plate is fixed after elastic deformation of the probes occurs. When a wafer is moved toward a probe head and the probes are moved upward by the wafer, the probes may be deformed to cause pressure exerting on guide holes of the guide plate. That is, when a test on the wafer is repeated, abrasion occurs in the guide holes as the probes are restored and deformed. In addition, if the position of an intermediate guide plate causing deformation is not fixed, the intermediate guide plate may be movable in both a deformed direction of the probes and a direction opposite to the deformed direction as the probes are moved. That is, pressure may be exerted on the probes due to unexpected movement of the intermediate guide plate.

On the contrary, in the present disclosure, the guide member 70 is provided at a side of the intermediate guide plate 60 except for the deformed direction of the probes 80. Specifically, if the intermediate guide plate 60 and the guide member 70 are moved in a right direction in FIG. 7 to cause the probes 80 to be elastically deformed, the guide member 70 may be provided at left, upper, and lower sides of the intermediate guide plate 60. That is, the movement of the intermediate guide plate 60 is limited by the guide member 70 not only in a y-axis direction, but also in an x-axis negative direction. That is, the movement of the intermediate guide plate 60 may be guided only in an intended direction by the guide member 70. Therefore, when the probes 80 are moved upward by the wafer W, the probes 80 undergo a greater deformation than before contact with the wafer W, and as the probes 80 are deformed, the intermediate guide plate 60 may be moved toward a direction in which the guide member 70 is not provided. That is, the intermediate guide plate 60 may be moved in conjunction with the deformation of the probes 80, thereby preventing abrasion in the intermediate guide holes 61 due to the deformation of the probes 80.

Figure 8:
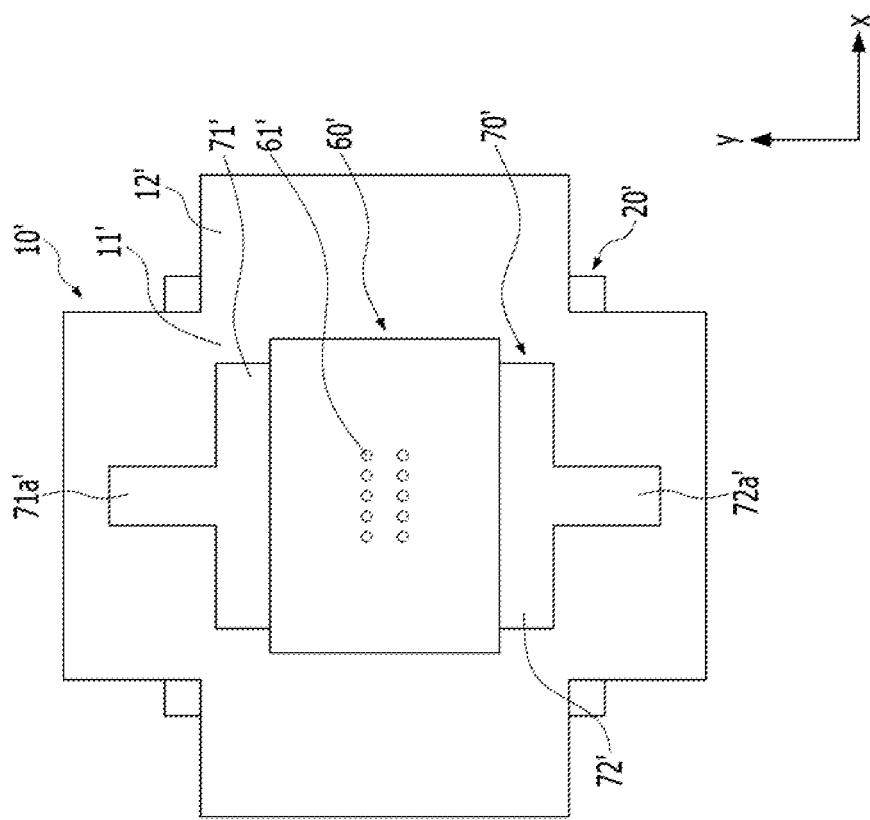
FIG. 8 is a top view illustrating a probe head of a probe card according to a second exemplary embodiment of the present disclosure, except for an upper guide plate.

FIG. 8 is a top view illustrating a probe head of a probe card according to a second exemplary embodiment of the present disclosure, except for an upper guide plate. Compared to the first embodiment, the second embodiment has a difference in the shape of a guide member. Therefore, the difference will be mainly described, and the description and reference numerals of the first embodiment will be used for the same parts.

Referring to FIG. 8, a guide member 70' is provided on each of two side surfaces of an intermediate guide plate 60'. Specifically, the respective guide members 70' may be provided at positions facing each other. For example, the guide members 70' may be provided at upper and lower sides of the intermediate guide plate 60' to limit the movement of the intermediate guide plate 60'. That is, the intermediate guide plate 60' may be limited from being moved in the y-axis direction, but allowed to be moved only in the x-axis direction.

The guide members 70' may be fixed to a support member 10' before insertion of the probes 80, or may be fixed to the support member 10' after insertion of the probes 80. In this case, the probes 80 may be elastically deformed in conjunction with the x-axis movement of the intermediate guide plate 60'.

In the present embodiment, although it is described as an example that the movement of the intermediate guide plate 60' in the y-axis direction is limited, the movement limit of the intermediate guide plate 60' is not limited thereto. For example, when the guide members 70' are provided at left and right sides of the intermediate guide plate 60', the intermediate guide plate 60' may be limited from being moved in the x-axis direction, but allowed to be moved only in the y-axis direction. In this case, the probes 80 may be elastically deformed in conjunction with the y-axis movement of the intermediate guide plate 60'. That is, depending on the positions of the guide members 70' as above, the intermediate guide plate 60' may be allowed to be moved only in the x-axis or y-axis direction.

FIGS. 9A, 9B, 9C, and 9D are top views illustrating a probe head of a probe card according to a third exemplary embodiment of the present disclosure, except for an upper guide plate. Compared to the first embodiment, the third embodiment has a difference in the shape of a guide member. Therefore, the difference will be mainly described, and the description and reference numerals of the first embodiment will be used for the same parts.

Referring to FIG. 9, a plurality of guide members 70" may be provided, including a first guide member 71", a second guide member 72", a third guide member 73", and a fourth guide member 74". In this case, the first guide member 71", the second guide member 72", the third guide member 73", and the fourth guide member 74" may be provided separately.

Figure 9A:
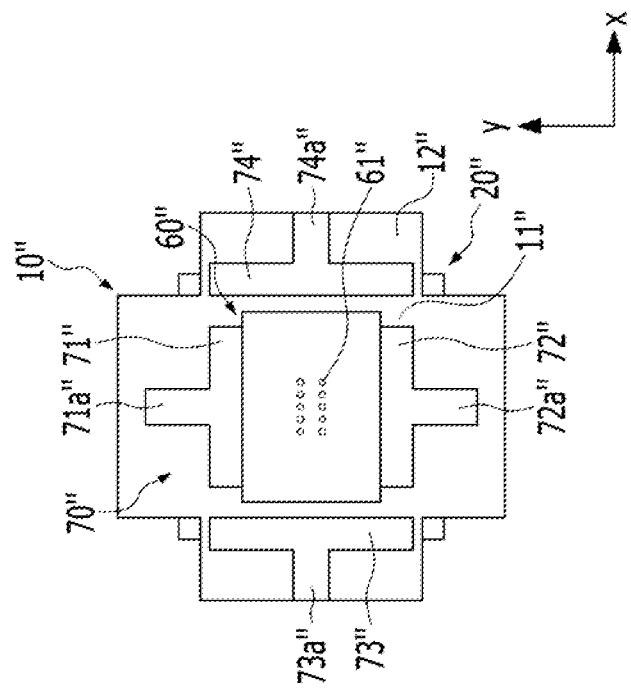
FIGS. 9A, 9B, 9C, and 9D are top views illustrating a probe head of a probe card according to a third exemplary embodiment of the present disclosure, except for an upper guide plate.

The guide members 70" may be selectively positioned on respective side surfaces of an intermediate guide plate 60" according to elastic deformation of probes 80. Specifically, as illustrated in FIG. 9A, in order to enable the movement of the intermediate guide plate 60" in all four directions, all the four guide members 70" may be provided a predetermined distance apart from the intermediate guide plate 60". That is, the intermediate guide plate 60" may be allowed to be moved both in an x-axis direction and in a y-axis direction.

Figure 9B:
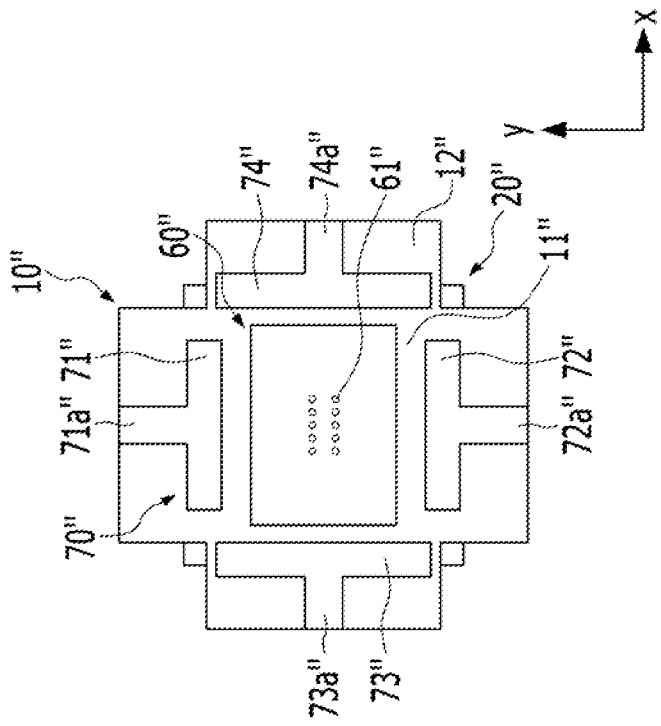

In addition, as illustrated in FIG. 9B, in order to enable the movement of the intermediate guide plate 60" in two directions, the first guide member 71" and the second guide member 72" may be provided in contact with the intermediate guide plate 60", while the third guide member 73" and the fourth guide member 74" may be provided a predetermined distance apart from the intermediate guide plate 60". That is, the intermediate guide plate 60" may be allowed to be moved in the x-axis direction, but limited from being moved in the y-axis direction.

Figure 9C:
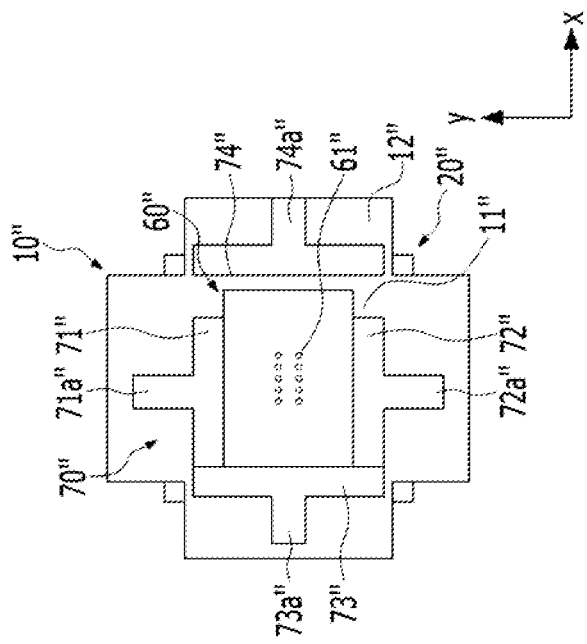

Alternatively, as illustrated in FIG. 9C, the third guide member 73" and the fourth guide member 74" may be provided in contact with the intermediate guide plate 60", while the first guide member 71" and the second guide member 72" may be provided a predetermined distance apart from the intermediate guide plate 60". That is, the intermediate guide plate 60" may be allowed to be moved in the y-axis direction, but limited from being moved in the x-axis direction.

Figure 9D:
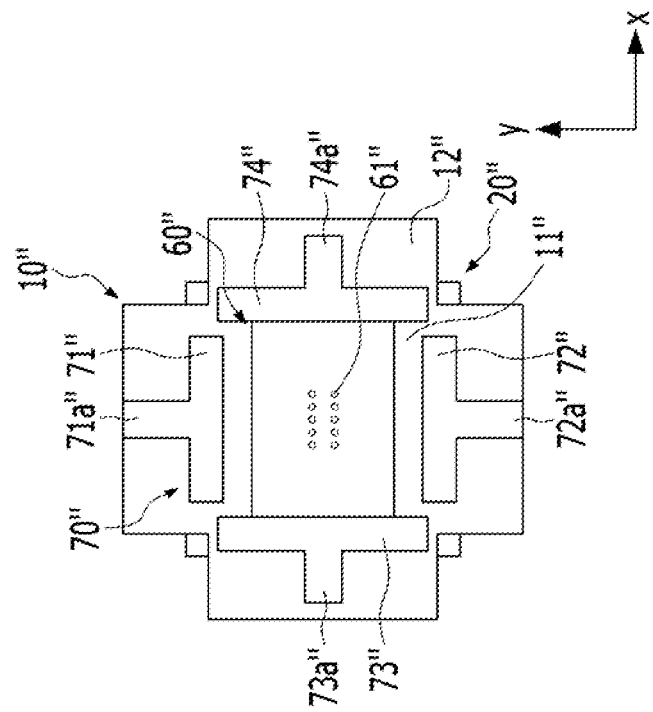

Alternatively, as illustrated in FIG. 9D, in order to enable the movement of the intermediate guide plate 60" in one direction, the first guide member 71", the second guide member 72", and the third guide member 73" may be provided in contact with the intermediate guide plate 60", while the fourth guide member 74" may be provided at a predetermined distance apart from the intermediate guide plate 60". That is, the intermediate guide plate 60" may be limited from being moved in the y-axis direction, but allowed to be moved in only one direction along the x-axis.

With such a structure of the intermediate guide plate 60", the guide members 70" may selectively limit the movement of the intermediate guide plate 60". That is, by adjusting the positions of the guide members 70" as necessary, unnecessary contact between the guide member 70" and the intermediate guide plate 60" may be reduced. That is, the life span of the guide member 70" may be extended. In addition, abrasion of inner walls of the guide holes of the intermediate guide plate 60" may be minimized.

While particular embodiments of the probe head and the probe card having the same according to the present disclosure have been described, it is merely illustrative and is not intended to limit the scope of the present disclosure and should be construed as having widest range based on the spirit of present disclosure. Those of ordinary skill in the art may combine and substitute the disclosed embodiments to perform a particular pattern of shape that has not been noted, but it is also within the scope of the present disclosure. It will be apparent to those of ordinary skill in the art that various changes and modifications may be readily made without departing from the spirit and scope of the present disclosure.

What is claimed is:

1. A probe head of a probe card, the probe head comprising:
   an upper guide plate having an upper guide hole;
   a lower guide plate having a lower guide hole;
   an intermediate guide plate having an intermediate guide hole, and provided between the upper guide plate and the lower guide plate; and
   a guide member provided at a side of the intermediate guide plate,
   wherein the intermediate guide plate is limited in movement by the guide member,
   wherein the guide member is movable to move the intermediate guide plate in a first direction, and is positionally fixed after deforming a probe passing through the intermediate guide hole, and
   wherein, when positionally fixed, the guide member is configured to limit movement of the intermediate guide plate in a second direction opposite to the first direction but to not limit movement of the intermediate guide plate in the first direction.

2. The probe head of claim 1, wherein the guide member has a 'U' shape, and is provided on each of all side surfaces of the intermediate guide plate except for one side surface.

3. The probe head of claim 1, wherein the guide member is provided on each of two side surfaces of the intermediate guide plate, and the respective guide members are provided at positions facing each other.

4. The probe head of claim 1, wherein the guide member comprises a plurality of guide members, each of which having a size equal to that of each of side surfaces of the intermediate guide plate, and
wherein the respective guide members are selectively provided on the side surfaces of the intermediate guide plate.

5. A probe card, comprising:
a space transformer having a probe connection pad electrically connected to each of a plurality of probes; and
a probe head provided below the space transformer,
wherein the probe head comprises:
an upper guide plate having an upper guide hole;
a lower guide plate having a lower guide hole;
an intermediate guide plate having an intermediate guide hole, and provided between the upper guide plate and the lower guide plate; and,
a guide member provided at a side of the intermediate guide plate, and
wherein the intermediate guide plate is limited in movement by the guide member,
wherein the guide member is movable to move the intermediate guide plate in a first direction, and is positionally fixed after deforming a probe passing through the intermediate guide hole, and
wherein, when positionally fixed, the guide member is configured to limit movement of the intermediate guide plate in a second direction opposite to the first direction but to not limit movement of the intermediate guide plate in the first direction.

* * * * *